United States Patent
Sayyah et al.

(10) Patent No.: US 7,142,348 B2
(45) Date of Patent: Nov. 28, 2006

(54) CONFORMAL RETRO-MODULATOR OPTICAL DEVICES

(75) Inventors: Keyvan Sayyah, Santa Monica, CA (US); David M. Pepper, Malibu, CA (US); Peter D. Brewer, Westlake Village, CA (US); Anson Au, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/153,977

(22) Filed: Jun. 15, 2005

(65) Prior Publication Data

US 2006/0239696 A1    Oct. 26, 2006

Related U.S. Application Data

(62) Division of application No. 10/690,486, filed on Oct. 20, 2003, now Pat. No. 6,954,302.

(60) Provisional application No. 60/420,177, filed on Oct. 21, 2002.

(51) Int. Cl.
G02B 26/00    (2006.01)
G01J 1/44    (2006.01)

(52) U.S. Cl. .................. 359/291; 359/298; 250/214 R

(58) Field of Classification Search ................ 359/291, 359/292, 295, 298, 316, 318, 319, 320, 237, 359/248; 250/208.1, 214 R
See application file for complete search history.

(56) References Cited

U.S. PATENT DOCUMENTS

| 5,130,843 A | 7/1992 | He et al. ..................... 359/285 |
| 5,172,262 A | 12/1992 | Hornbeck ................... 359/223 |
| 5,315,430 A | 5/1994 | Brennan et al. ............. 359/248 |
| 5,412,499 A | 5/1995 | Chiu et al. .................. 359/248 |
| 5,426,312 A * | 6/1995 | Whitehead ................... 257/21 |
| 5,488,504 A * | 1/1996 | Worchesky et al. ......... 359/248 |
| 5,777,318 A | 7/1998 | Krishnamoorthy et al. ..................... 250/214 LS |
| 5,808,797 A | 9/1998 | Bloom et al. ............... 359/572 |
| 5,909,303 A * | 6/1999 | Trezza et al. ............... 359/248 |
| 5,966,227 A | 10/1999 | Dubois et al. .............. 359/170 |
| 6,154,299 A | 11/2000 | Gilbreath et al. ........... 359/170 |
| 6,455,931 B1 | 9/2002 | Hamilton, Jr. et al. ...... 257/723 |
| 6,538,800 B1 | 3/2003 | Huibers ...................... 359/291 |
| 6,597,490 B1 | 7/2003 | Tayebati ..................... 359/291 |
| 6,831,769 B1 | 12/2004 | Holman et al. |
| 2002/0001046 A1 | 1/2002 | Jacobsen et al. ............. 349/42 |
| 2004/0075880 A1 | 4/2004 | Pepper et al. ............... 359/212 |
| 2004/0114210 A1 | 6/2004 | Fitzpatrick et al. ......... 359/291 |

* cited by examiner

FOREIGN PATENT DOCUMENTS

WO    98/35328    8/1998

OTHER PUBLICATIONS

Biermann, M.L., et al., "Design and Analysis of a Diffraction-Limited Cat's-Eye Retroreflector," *Opt. Eng.*, vol. 41, No. 7, pp. 1655-1660 (Jul. 2002).

*Primary Examiner*—Scott J. Sugarman
*Assistant Examiner*—M. Hasan
(74) *Attorney, Agent, or Firm*—Ladas & Parry LLP

(57) ABSTRACT

A conformal retro-modulator optical apparatus. The apparatus includes an array of multiple quantum well devices disposed in a thin array. A plastic support element is bonded to the thin array, the plastic support element having a thickness greater that of the thin array. The plastic support element is preferably plastic at elevated temperatures above room temperature, thereby allowing the plastic support element and the thin array of multiple well device disposed therein to conform to a predetermined shape, yet being rigid at room temperature.

8 Claims, 9 Drawing Sheets

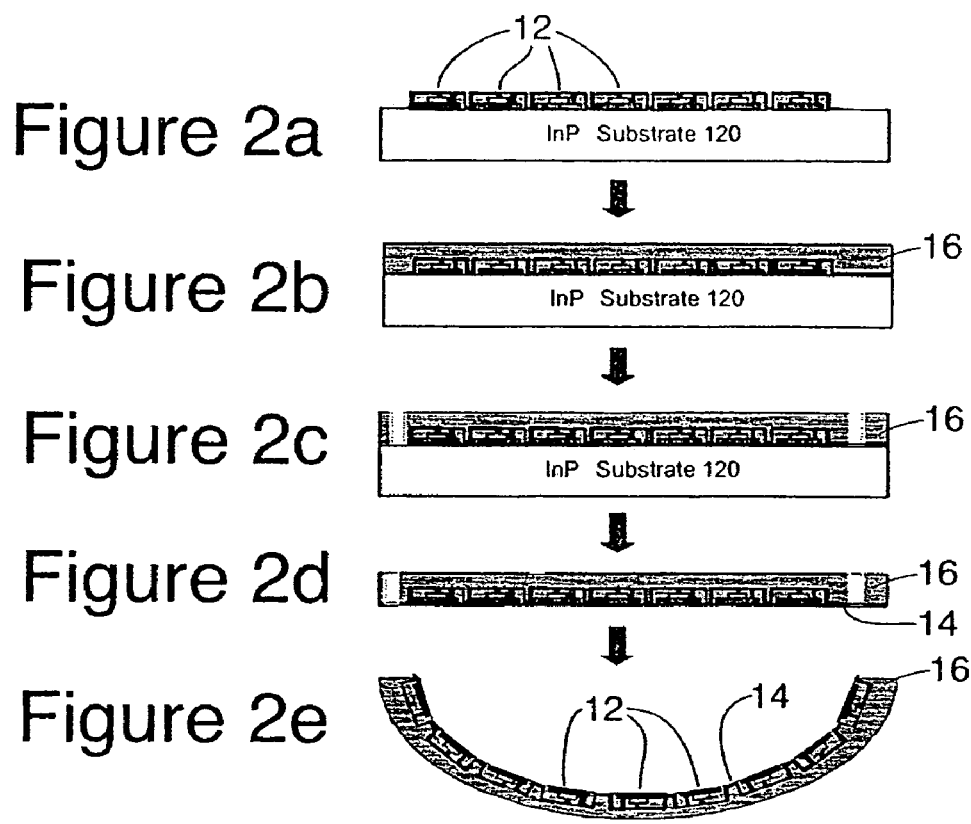
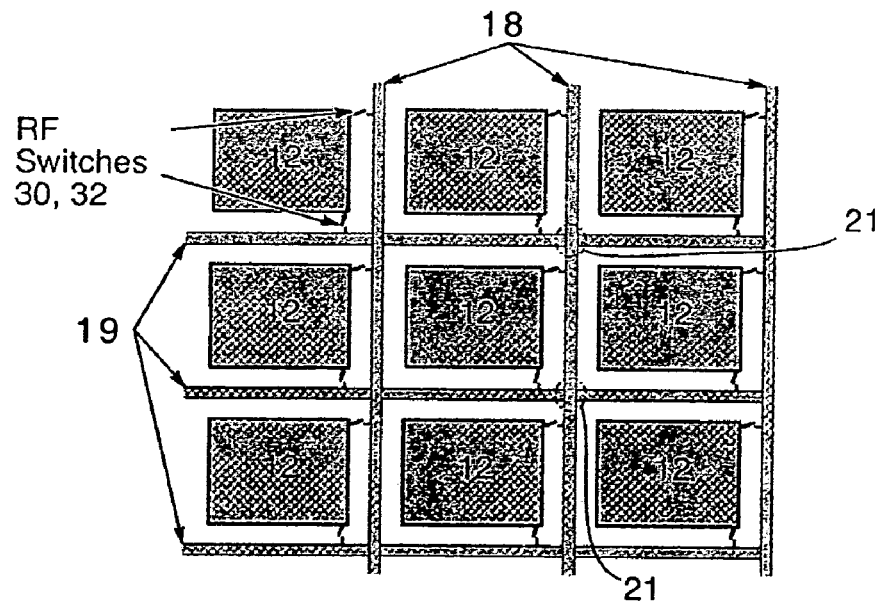
Figure 3

FIG. 3f
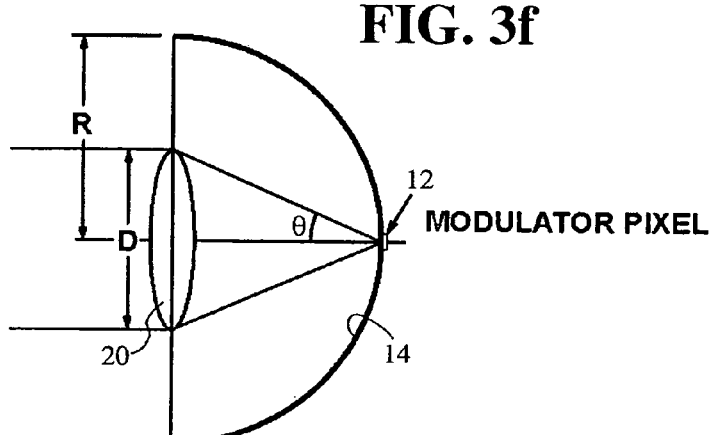
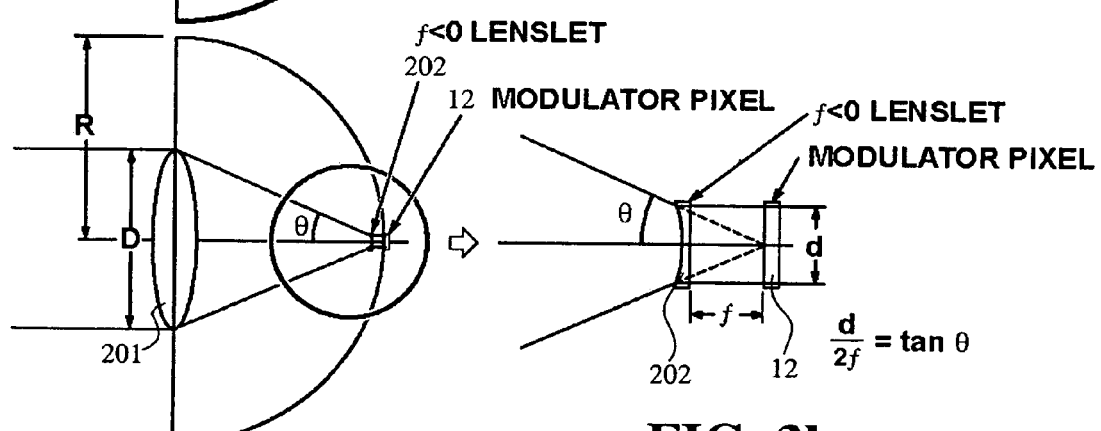
FIG. 3g
FIG. 3h

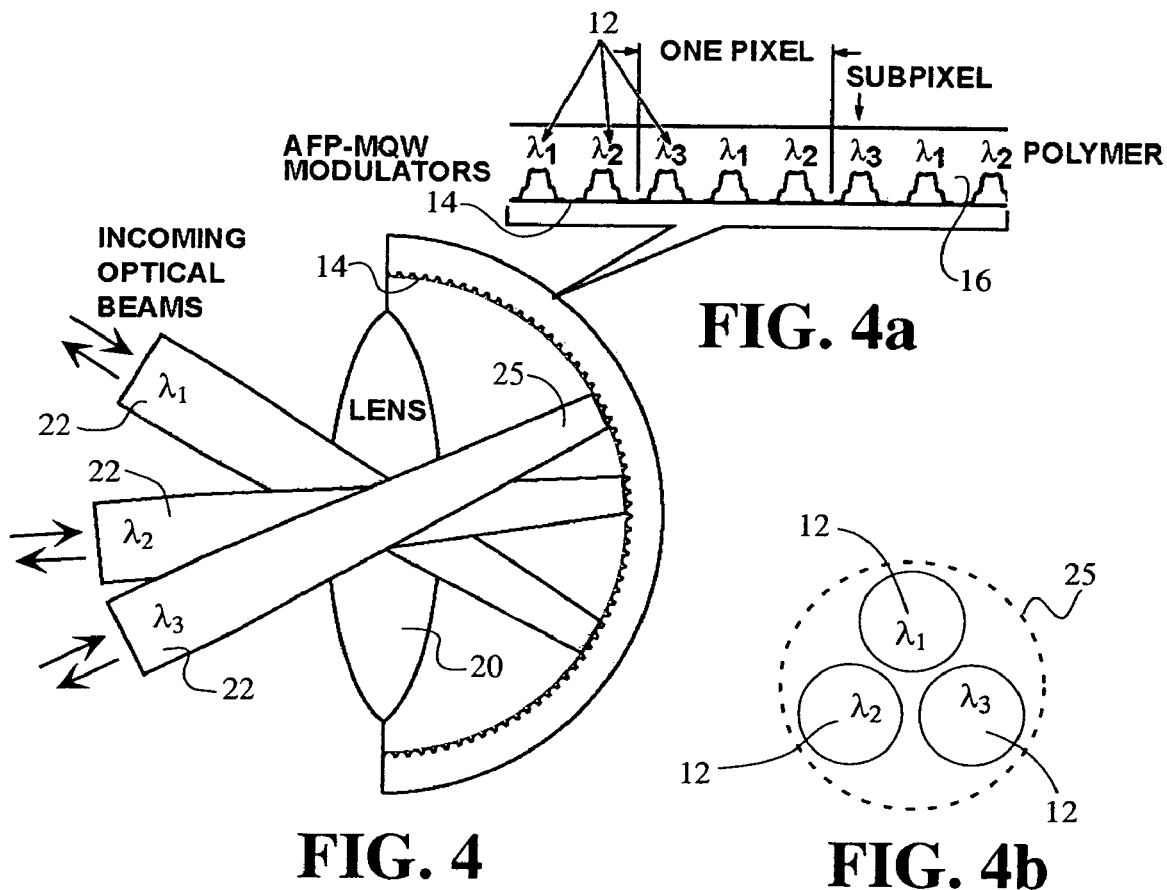
FIG. 4a
FIG. 4
FIG. 4b
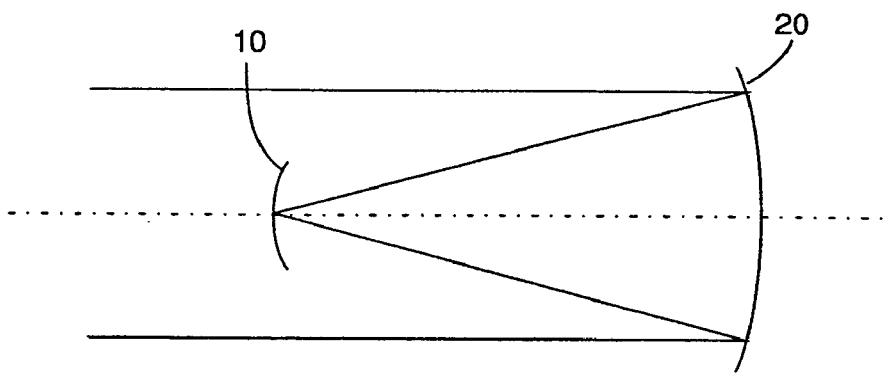
Figure 4c

2. Description of Related Art

CONFORMAL RETRO-MODULATOR OPTICAL DEVICES

CROSS REFERENCE TO RELATED APPLICATIONS

This patent application is a divisional application of U.S. application Ser. No. 10/690,486, now U.S. Pat. No. 6,954,302 filed Oct. 20, 2003, which application is related to and claims the benefits of U.S. Provisional Patent Application No. 60/420,177 filed Oct. 21, 2002, the disclosure of which is hereby incorporated herein by this reference. The subject matter of the present application may also be related to U.S. patent application Ser. No. 10/661,028 filed Sep. 11, 2003 and entitled "Optical Retro-Reflective Apparatus with Modulation Capability".

BACKGROUND

1. Field

The present invention relates to new classes of pixellated and conformal Modulated-Retro-Reflective (MRR) optical devices, including modulated corner-cube devices as well as modulated cat's eye devices. Instead of using a single, large-area modulator, the disclosed modulator utilizes an array of individual pixels, which can be independently controlled or modulated. The array need not be planar and can be formed to any shape as required by the optical design of the specific device structure.

2. Description of Related Art

The novel classes of modulated retro-reflective (MRR) devices disclosed herein may be used for remote sensing, IFF (identification, friend or foe), laser communication links, and optical networks, such as optical relay nodes.

The prior art includes conventional retro-modulation devices using bulk structures, as well as Multiple Quantum Well (MQW) based devices. See U.S. Pat. No. 6,154,299 by Gilbreath et al. of the Naval Research Laboratory entitled "Modulating Retroreflector using Multiple Quantum Well Technology", the disclosure of which is hereby incorporated herein by reference. The prior art requires fabrication of the entire MQW structure and/or a pixellated array on a large common, planar substrate. For efficient link performance, a large aperture (for example, in the 10 cm range) may be required. Such a relatively large structure demands a very uniform deposition process so that the entire surface has the same band structure and excitonic resonances, etc. In addition, the depth-of-modulation (optical contrast ratio) described in the prior art are dramatically limited by the finite thickness of the thin MQW modulator (typically, 1 μm total thickness). This follows since the MQW component of the prior art is passed either once or twice by the optical beam. By contrast, in accordance with one aspect of the present invention, the optical beam effectively multi-passes the MQW, since it is formed within a Fabry Perot cavity, so the effective number of optical transits can be in the range of 10 to over 100, depending on the design of the cavity Q. Moreover, such a planar structure cannot be flexed or made conformal to curved, generalized surfaces. This would normally limit the ability to retrofit existing large, curved surfaces with a large-area MRR device of such a construction. Moreover, the field-of-view may be limited by such a planar structure, even in the case of a large-area device. In addition, the prior art does not describe how to use a dual-mode device for the MRR structure (for both photo-detection and optical modulation). Also, the prior art does not disclose how to fabricate a device with Low Probability of Intercept/Detection (LPI/LPD) in a common element, so that the retro-reflected beam is disabled prior to a successful handshaking procedure (the prior art requires a stand-alone optical shutter to prevent a third party from interrogating the MRR). Finally, the prior art does not disclose a simple method of how to enable the MRR to deal with multiple wavelength indication.

See, also, U.S. Pat. No. 6,455,931 to Hamilton, et al., which is owned by Raytheon Company of Lexington, Mass., the disclosure of which is hereby incorporated herein by reference.

Utilizing a stand-alone shutter to prevent undesirable interrogation of the MRR (as would be the case in the prior art) has a disadvantage since it does not allow the prior art devices to function as a detector and a retro-modulator. Rather, separate detector and modulator assemblies must be utilized. One of the features of the present invention is that while the MRR is in an off-state (that is, while it is effectively shuttered), it can also act as an efficient detector.

The prior art also includes the use of retro-reflectors in communication system. See "Design and analysis of a diffraction-limited cat's-eye retroreflector" by Biermann, Rabinovich, Mahon and Gilbreath, *Opt. Eng.* 41(7), July 2002, pp 1655–1660, the disclosure of which is hereby incorporated herein by reference.

In accordance with one aspect of the present invention novel classes of MRR devices are utilized for remote sensing, IFF (identification, friend or foe), laser communication links, and optical networks, such as optical relay nodes and a novel fabrication technique. In terms of fabrication and in accordance with one aspect of the present invention, a technique is provided by which such devices can be robustly manufactured so that they can conform to the surfaces upon which are placed (planar, curved, etc. surfaces). The disclosed devices are especially useful because they can be positioned on most curved surfaces (e.g., on the surface of a hemisphere, similar in layout to an eye of a bee or fly). Hence, the overall device can thus accommodate a large field-of-view (FOV) with an overall aperture much greater than that provided by existing fabrication techniques. The disclosed devices can also withstand much greater vibration, acceleration and deformation, since the limiting dimension is now the individual pixel and not the overall wafer dimension or aperture. Yet a further feature of this invention is that a variety of different devices can be fabricated with high yield, owing to the fact that all the pixels can be qualified prior to their self-assembly.

When the MRR devices disclosed herein are in an off state, they are optically opaque to a optical probe, since the disclosed MRR devices then absorb the incoming light while performing a detection function. Also, since the disclosed MRR devices preferably utilize arrays of individual detectors/modulators, the ability to provide a shuttering mechanism which works on an individual detector/modulator basis, certain ones of the detectors/modulators can be shuttered (in an off state) while one or more other detectors/modulators are modulating a probe beam.

The various possible advantages of this invention can be summarized by following (this list is not necessarily all inclusive nor do all embodiments of the invention necessarily enjoy all these advantages):

First, by using a pixellated modulator structure, the prior art compromises between the modulator size for increased data rates and the MRR aperture for increased optical power can be overcome. This allows the design of the individual modulator pixel size for the desired modulation rate and the appropriate number of pixels to cover the required optical aperture.

Second, a Multiple Quantum Well MQW asymmetric Fabry-Perot resonator structure can be conveniently utilized, which results in enhanced on-off contrast ratio and lower voltage operation compared to a conventional transmissive MQW modulator.

Third, the disclosed MQW pixels can operate as both modulators and photodetectors so that only the illuminated pixel(s) need be activated for retro-modulation. This significantly reduces the power dissipation of the MRR. As a result, a "smart" and more secure retro-reflector device can be used to communicate with an interrogator in a selected portion of the FOV of the device, while disabling the device from being interrogated by undesirable third parties appearing in other portions of the FOV of the device. That is, once a handshake procedure has been completed, only the pixel(s) that need be activated (modulated) are activated (modulated), thereby restricting the retro-modulated return for that specified FOV, and disabling a retro-modulated return from being reflected to other parties. This feature also tends to reduce the overall device power consumption of the disclosed device.

Fourth, by using self-assembled pixel transfer technology, the MQW modulator pixels can be positioned on any surface in a predetermined arrangement for optimum MRR optical performance. For example, the cat's-eye retro-reflector architecture, which uses a hemispherical reflecting surface, can be readily realized using the disclosed conformal and pixellated MQW modulator structure. Such a structure can be preformed, such as by casting or molding, and then the individual pixels can be applied thereto using self-assembled pixel transfer technology. This hemispherical MRR structure will greatly enhance its field-of-view independent of its method of manufacture.

Fifth, by utilizing a flexible substrate, the entire retro-device can be conformally attached to a non-planar surface, such as the hemispherical surface mentioned above, thereby enabling the installation of the device onto an existing surface having an arbitrary curvature (e.g., curved platforms and structures) and also enabling effective installation of the device onto a surface which must be curved or conveniently is curved, such as a wing or airframe of an aircraft.

Sixth: Yet another advantage of using the disclosed self-assembled pixel transfer technique for the MRR is that different MQW modulator pixels designed for operation at different wavelengths can be positioned at alternate sites on the retro-reflector surface, hence allowing multi-wavelength MRR operation.

Seventh, by utilizing an Asymmetric Fabry-Perot resonator structure as an integrated detector/modulator, the detection/handshake state of the device can be biased so that, in this mode, the device has optimal detection efficiency. In this mode of operation, nearly all the incident photons can be absorbed in a thin MQW layer. It turns out that in this optimal detection mode, the net specular reflection from the device is also at a minimum. This follows, since the phasing of the beams is such that the Fresnel reflection is canceled out by the Fabry-Perot reflections. In this manner, the specular reflectivity of the MRR is effectively nulled out (all the photons are coupled into the asymmetric Fabry-Perot resonator), resulting in a near-zero retro-reflective "glint" return from the structure (i.e., the retro-reflector is effectively an absorbing structure, with LPI/LPD).

Eighth, the disclosed apparatus can be used for optical communication systems, wireless networks and links, remote sensor nodes and IFF scenarios. Such devices can be employed in myriad free-space applications. It can also be utilized in terrestrial systems as part of rapidly reconfigurable optical links for (i) in-factory transfer of data such as computer-aided design (CAD), (ii) video training, (iii) inventory control, (iv) manufacturing-on-demand information, (v) x-ray data or (vi) any other information requiring high bandwidths.

Ninth, the retro-modulator disclosed herein can also be used in roadside optical information kiosks for automobiles and other vehicles. By placing these potentially inexpensive devices in various locations on highways and city streets (for example, traffic lights), the MRR can relay a variety of traffic and entertainment information using a simple optical probe beam positioned on the car. Alternately, traffic control personnel can use this technology to obtain detailed information about the vehicle and its operating conditions by optical probing. In this case, the retro-modulator will be installed in the car. In yet another vehicular related application, the optical probe is installed in the vehicle for use with opto-electronic-aided auto service to transfer data required to update some electronic components, for example, software or firmware in the vehicle).

Tenth, in terms of a military application, the disclosed MRR is an ideal device for IFF applications where by simply probing a target equipped with the retro-modulator and programmed with the correct code, the target can be easily identified. In addition, these MRRs can be mounted on missiles and/or torpedoes so that an optical beam can easily relay target and tracking information back at the launch site.

Eleventh, the disclosed MRR devices can also be used in airport and airborne traffic control applications for airplane accident avoidance and aircraft identification information. Furthermore, there is a potential for long-range inter-satellite links as well as shorter-range shuttle-to-platform optical links using the disclosed MRR devices. In these cases, the auto-alignment properties of the MRR, coupled with its monolithic, compact architecture, will greatly reduce the prime power requirements, cost, and weight requirements of the system over conventional optical links that employ sources and pointing/tracking subsystems. Finally, in the case of terrestrial applications, adaptive optical techniques can be used to form up the interrogation beam onto the MRR, thereby compensating for wavefront distortions along the path, as well as optimizing the link budget.

It should be noted that there are many aspects of this invention and it will be apparent to those skilled in the art that not all of the features, advantages and applications discussed above will necessarily be applicable to all embodiments.

SUMMARY

In one aspect this invention involves new classes of pixellated and conformal modulated-retro-reflective devices, including modulated corner-cube devices as well as modulated cat's eye devices. Instead of a single, large-area modulator, the modulator consists of an array of individual "pixels," which can be independently controlled or modulated. The array need not be planar and preferably can be formed to any shape as required by the optical design of the specific device structure. The pixels are in the form of small ($\approx$100 µm) elements, such as multiple quantum wells (MQWs), which form the modulation structures.

In another aspect, this invention utilizes self-assembly fabrication and/or transfer bonding techniques to realize these array structures. The pixels can be assembled into flexible substrates to complete the overall device, which can be conformed to the surface to which it is to be attached.

In addition, the pixels need not be all the same. That is, different pixels can be resonant at different wavelengths, as an example, so that a WDM device can be realized, with redundancy, if necessary.

In yet another aspect of this invention, Asymmetric Fabry-Perot (AFP) MQW structures are utilized as the pixellated elements. The AFP structures can perform dual functions: they can act an optical modulator (low-voltage, high-depth-of-modulation and bandwidth) and as an optical detector (high efficiency, high bandwidth). Finally, refractive, reflective, and/or diffractive optical elements (in transmission or reflection modes) can be employed to complete the specific device structure. The result is a low-cost, rugged, conformal, and robust retro-modulation device with large field-of-view and large field-of-regard, capable of high-bandwidth communication and IFF (identification, friend or foe) applications, with Low Probability of Intercept/Detection (LPI/LPD).

BRIEF DESCRIPTION OF THE DRAWINGS

FIGS. 2a–2e are side elevation views of a conformal pixellated AFP MQW modulator structure 5 during various steps of a fabrication process;

FIG. 3 is a schematic diagram of a two-dimensional AFP MQW modulator pixel array in plan view depicted with RF switches in each pixel for single pixel-at-a-time activation;

FIGS. 3f–3h show how the lens sizes may be determined when lenses are used in the optical arrangement;

FIG. 4 depicts a multiple frequency embodiment of a pixellated AFP MQW modulator/detector structure;

FIG. 4a is a schematic view of eight AFP MQW modulator/detector devices imbedded in a plastic substrate which form a portion of a conformal pixellated structure of FIG. 4;

FIG. 4b is a plan view of three AFP MQW modulator/detector devices, each having a different frequency responsiveness, which three devices define a single pixel;

FIG. 4c is a schematic representation of a reflecting embodiment; and

DETAILED DESCRIPTION

A Conformal Modulated-Retro-Reflective Optical Device

Figures 1, 1A:
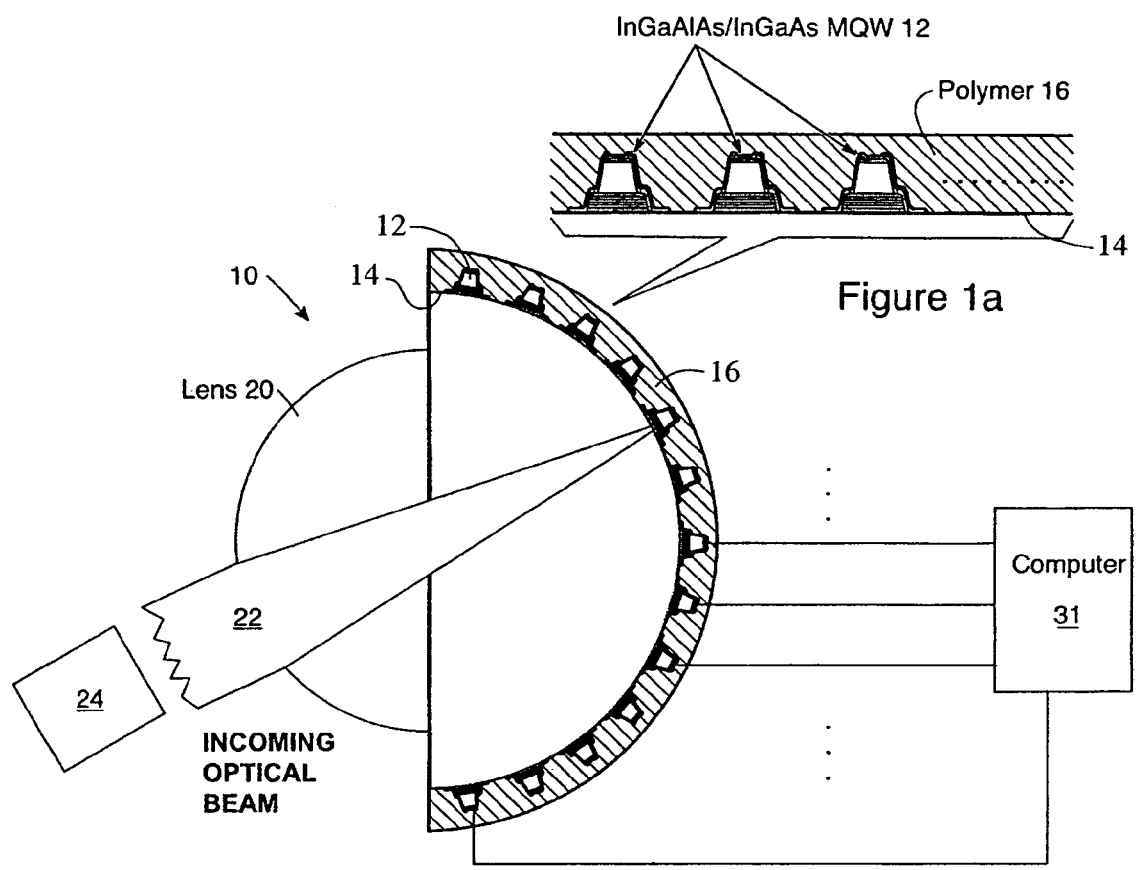
FIG. 1 is a schematic view of a conformal pixellated an AFP MQW modulator structure in a cat's-eye retro-reflector configuration.
FIG. 1a is a schematic view of three AFP MQW modulator/detector devices imbedded in a plastic substrate that forms a portion of a conformal pixellated structure of FIG. 1.

FIG. 1 is sectional view through an embodiment of a conformal retro-modulator reflective optical device 10. The device 10 has an array of modulator/detector pixels 12 disposed along a surface 14. An optical arrangement 20 (such as a lens) focuses an incoming optical beam 22 on one or more of the pixels 12 in the array. In this embodiment, the surface 14 conforms to a hemispherical shape. As will be seen, the surface 14 may be of any desired shape, including planar, but the optical arrangement 20 does need to be able to deliver incoming light 22 to selected pixels 12. In FIG. 1 the optical arrangement 20 is depicted as a single lens and a single lens can often suitably focus the beam on a geometric surface like the hemispherical surface 14 shown in FIG. 1. Other optical arrangements 20 may be utilized, including Fresnel lenses, holographic "lenses", diffractive optical gratings, computer-controlled phase plates, multiple lens arrangements, and purely reflective arrangements (see FIG. 4c). As such, the optical arrangement 20 may be planar or nearly planar, if so desired. Additionally, the optical arrangement 20 lens can be used in combination with lenslets affixed or disposed at or near surface 14.

The lens or optical arrangement 20 may focus the incoming optical beam 22 on a single pixel 12 or the spot formed by the focussed beam may fall on two or more adjacent pixels 12. As will be seen, each pixel may comprise a single modulator 12 or it may comprise multiple modulators each sensitive to a different wavelength and/or it may comprise switching devices.

The modulator/detector pixels 12 can both detect light falling thereon and can selectively reflect or modulate the incoming light in response to electrical signals applied to the pixel. A suitable device for each modulator/detector pixel 12 in the array is a Multiple Quantum Well (MQW) device. MQW devices are well known in the art; typically they have alternating layers of different semiconductor materials (see FIG. 1b), which may be formed, for example, by molecular beam epitaxy or metal organic chemical vapor deposition. Typical semiconductor materials used in MQW devices include, for example, GaAs, AlGaAs, and InGaAs. The semiconductor material with the lowest bandgap energy is known as the well, while the semiconductor material with the higher bandgap energy is called the barrier. At wavelengths longer than a certain frequency, these semiconductor materials are transparent, while at shorter wavelengths (i.e. higher frequencies), they are opaque. At that "certain" frequency between transparency and opaqueness, these semiconductor materials exhibit a phenomenon known as "exciton." For normal semiconductor materials at room temperature, the exciton feature is not particularly distinct. But in a MQW device, the exciton feature becomes much more distinct and its associated wavelength (corresponding to the certain wavelength noted above) becomes a function of both the thicknesses of the semiconductor layers and of an applied electric field.

If the electric field intensity is modulated, then the MQW device, in an appropriate optical arrangement, will reflect light, intensity modulating the reflected light according to the intensity of the applied electric field.

The modulated retro-reflective (MRR) device 10 of the present invention can preferably be conformally shaped and attached onto an arbitrarily shaped surface. The MRR device can be conveniently made from an array of MQW devices arranged as an array of pixels 12. A MRR device in accordance with the present invention can be conveniently placed onto existing structures, whose constraints may otherwise negate the possibility of using prior art MRR/MQW devices, which are typically of a planar, pyramidal, or spherical configuration. The overall device 10 structure of the present invention can be made to be concave, convex, etc. and can be shaped to conform to the desired surface to which it is to be attached. A key advantage of this invention is that a much greater field-of-regard (FOR) can be realized, since an entire hemisphere can be covered with a large MRR array, for example, in a cat's eye configuration.

The MRR 10, which includes an array of optical modulating devices 12 of the type preferably having a retro-reflecting surface, allows an incoming CW optical beam from the transmitter to be simultaneously modulated and reflected back to the transmitter/receiver on the same optical path 22.

An embodiment of a MRR 10 is shown in FIG. 1 in which the hemispherical surface 14 of a cats-eye configuration is populated with an array of reflective MQW modulator pixels 12 mounted in a flexible or deformable substrate, sheet or support layer 16, such as a polymer, including thermosetting materials, preferably using self-assembly or transfer bonding pixel transfer technologies. Preferably, the flexible or deformable material is relatively plastic at temperatures above room temperature, thereby allowing the substrate, sheet or support layer 16 and the array of modulator and/or detector pixels 12 embedded therein to conform to a hemispherical configuration (for example), while being relatively rigid at room temperature.

Figure 1B:
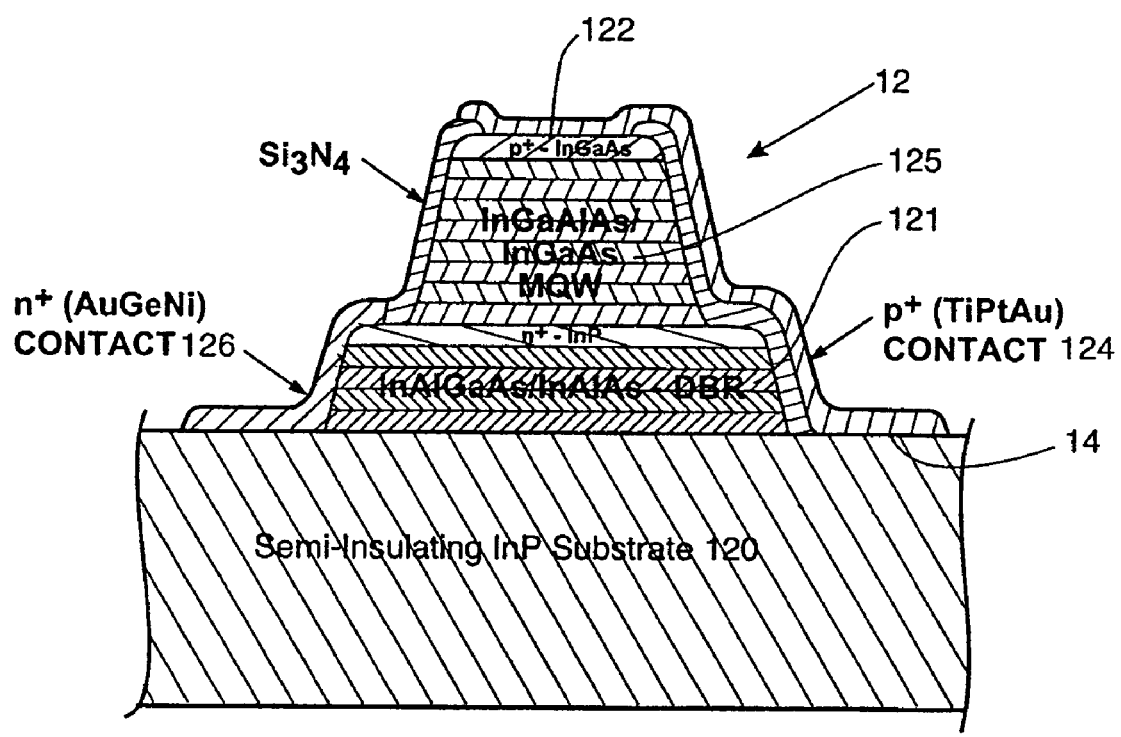
FIG. 1b is a detailed schematic view of a single AFP MQW modulator/detector device disposed on a temporary substrate.

FIG. 1a is an enlarged view of a few reflective MQW modulator pixels 12 supported by the flexible or deformable substrate 16 while FIG. 1b shows a single reflective MQW modulator 12 disposed on a removable substrate 120. The array of reflective MQW modulators 12 is preferably a two dimensional array and the reflective MQW modulators 12 are formed in as thin array of materials preferably using conventional semiconductor processing technologies in a flexible or deformable sheet 16. The individual MQW devices are preferably very thin and preferably have a thickness in the range of 1 to 5 µm. The sheet 16 itself, which includes a relatively thick layer of a flexible or deformable material, has an overall thickness which is sufficient to mechanically support the MQW modulators 12. Typical thicknesses of the flexible or deformable sheet 16 will depend upon the material used and are apt to fall in the range of 5–100 µm. At this range of thicknesses, the sheet 16 bearing the array of reflective MQW modulators 12 should preferably be able to support itself.

The incoming CW beam from a transmitter 24 is represented by reference numeral 22 in FIG. 1. The beam may be focussed on an individual one or individual ones of the reflective AFP MQW modulator pixels 12 in the array by means of optical arrangement 20. The incoming CW optical beam 22 from the transmitter 24 is simultaneously modulated (by the modulator pixel(s) 12 which it impinges and which are suitably electrically biased) and reflected back to the receiver on the same optical path as beam 22.

In FIGS. 1a and 1b, the reflective MQW modulators 12 have a shape which approximates a truncated cone. The individual reflective MQW modulators 12 are formed by a series of semiconductor layers 125 of AlGaInAs and GaInAs, for example. A partially reflective frontal mirror 121, which may be formed by an InAlGaAs/InAlAs Distributed Bragg Reflector (DBR), and a reflective metal back mirror 122, which may be formed of platinum, and therefore may also serve as a p-type contact metalization. Alternatively, a dielectric medium or a DBR can also service as the back mirror. Of course, the two mirrors 121, 122 impart an Asymmetrical Fabry-Perot (AFP) configuration if the distance between the two mirrors 121, 122 is controlled as is standard with Fabry-Perot devices. The AFP MQW modulators 12 may be designed to operate at an eye-safe 1550 nm and the distance between the two mirrors is selected accordingly. Of course, other frequencies of operation may also be utilized. In FIG. 1b a single MQW modulator 12 is shown on an InP substrate 120. The MQW devices 120 are formed as an array of devices 12 on substrate 120. After embedding devices 12 in polymer 16, the substrate 120 is removed.

As can be seen from FIG. 3, there are conductive pathways, channels or electrodes 18, 19 in sheet 16, which channels or electrodes are preferably conductors of a suitable metal and which attach to the truncated cone-like reflective MQW modulators 12 at their contacts 124 and 126. The conductive pathways, channels or electrodes 18 in sheet 16 are preferably formed in a matrix configuration using conventional semiconductor manufacturing technologies and, in use, are used to control the individual reflective MQW modulators 12 in the array. There are typically two conductive pathways, channels or electrodes 18, 19 in sheet 16 coupled to each reflective MQW modulator 12 in the array. The connection to the electrodes 18, 19 from external driver or control apparatus may be accomplished through the use of p-type or n-type semiconductor material or other suitable techniques. Whether all these conductive pathways, channels or electrodes 18, 19 are made accessible, at a connector, for example, as a matrix of conductive pathways, channels or electrodes 18 or whether switching techniques are utilized to reduce the number of conductors which need be brought out from the MRR shown in FIG. 1 is a matter of design choice. The same is true for the level at which the conductive pathways, channels or electrodes 18 in sheet 16 are formed. Recall that the conductive pathways, channels or electrodes 18 in sheet 16 attach to the contacts 124, 126 of each modulator 12. The conductive pathways, channels or electrodes 18 can be formed using semiconductor processing technologies and are conveniently separated from one another using a dielectric material, such as silicon dioxide or silicon nitride, which is also conveniently formed using semiconductor processing technologies. As such, using semiconductor processing technologies, the conductive pathways, channels or electrodes 18, 19 and the dielectric material will be arranged in layers as is conventional using that technology.

The conductive pathways, channels or electrodes 18, 19 can be disposed closer to surface 121 or to surface 122 of the modulators 12, and may be arranged to be immediately adjacent surface 14 with dielectric material being utilized a crossover point 21 where the conductors 18 in the matrix cross over one another. Arranging the conductive elements 18, 19 closer to surface 14 can make for convenient connection to the conductive pathways or channels 18 in sheet 16 while arranging the conductors 18, 19 closer to surface 121 can allow the modulators 12 to be more densely packed in sheet 16. The use of switching techniques to reduce the number of conductors which need be brought out from the MRR 10 will also tend to increase the spacing of the modulators 12 from one another. Since a tightly packed array of modulators 12 will be advantageous in many applications, certain engineering tradeoffs must be made when deciding how to layout the conductors 18, 19 in sheet 16 and in deciding whether adding semiconductor switches in sheet 16 make sense.

The supporting flexible or deformable substrate 16 is depicted in FIGS. 1 and 1a as being about the same thickness as modulators 12; however, this is for ease of illustration only. In fact, the supporting flexible or deformable substrate 16 has a thickness sufficient to provide sufficient mechanical support to sheet 16 in practical applications of this invention.

An aspect of this invention is that the modulator function is pixellated, so that each MQW device 12 in the array of such devices has its own Field-of-View (FOV), which called a sub-FOV herein and which can be independently controlled (e.g., modulated or not, or, different pixels can be modulated with different information). This allows the overall capacitance of the entire device to be minimized, since the encoding need only be imposed onto the modulator(s) 12 of choice. In addition, since only the desired sub-FOV is modulated, other interrogators outside this sub-FOV would not receive back a modulated retro-return, if so desired. In addition, the use of a pixellated array of modulators will enable the overall device to function even if one of the pixels becomes inoperative, whereas devices with a single, large modulation element would become totally inoperative if the modulator becomes inoperative.

The modulation elements 12 are preferably made from semiconductor materials, such materials being preferably implemented as MWQ devices, which, in turn, are preferably arranged in an AFP optical configuration. Moreover, other MQW material systems are known, including polymers and organic materials, etc. which can alternatively be used, such alternative materials also being used preferably in an AFP optical configuration. In addition, the substrate need not be lattice-matched to the modulation elements, enabling a wide variety of substrate materials to be used, which can be flexible, as well as transparent to other portions of the spectrum, if desired. Operation can be in the optical spectrum, as well as in the RF and mm-wave portions of the spectrum, by scaling disclosed embodiment to those frequencies.

In a preferred embodiment, the modulation elements 12 are in the form of Asymmetric Fabry-Perot (AFP) resonator based MQWs. This class of structure has the ability of encoding the desired modulation signal with relatively low voltage (owing to the Q-enhanced resonator). Moreover, the depth-of-modulation, as well as the "dark state" (or, contrast ratio) can be very high. The AFP modulator also has the feature that in the "off state," the reflectivity is at a minimum (near zero), so that interrogation by an undesirable third party will result in a near-zero "glint" return, enabling LPD/LPI scenarios to be achieved. This is a potentially important feature of the present invention. In the prior art an additional shutter has been placed in front of the modulators in order to enable zero off-state return.

Due to the use of pixel transfer techniques, the need for lattice-matched substrates can be obviated, enabling more general classes of substrates to be employed using various modulation elements (either reflective or transmissive elements) 12. A variety of pixel transfer techniques can be employed, including (1) self-assembly or fluidic transport of "pixels" with modulation capability (e.g., solid-state MQW or polymer-based optical/RF modulator elements) onto embossed/etched/molded substrates; and (2) transfer of modulator arrays using etching/liftoff/transfer-bonding processing onto polymer/plastic surfaces.

FIGS. 2a–2e schematically show steps which may be employed in order to make a conformal retro-modulator using a wafer-scale pixel transfer technique. This fabrication process involves:

(i) forming and interconnecting a planar two-dimensional array of modulator pixels 12 on a suitable substrate 120 (see FIGS. 1b and 2a);

(ii) embedding the array of prefabricated and interconnected modulator devices 12 into sheet 16 (see FIG. 2(b));

(iii) segmenting the support layer, as needed, for 2-D or 3-D curvature (see FIG. 2(c)); (iv) selectively removing the growth substrate 120 (see FIG. 2(d)); and (v) shaping the sheet 16 into a hemispherical conformal structure (see FIG. 2(e)).

For more information regarding the manufacturing techniques utilizing flexible substrates, reference may be made to U.S. Pat. No. 6,455,931 mentioned above.

An individual MRR 10 employs preferably an array of pixellated modulators 12 (as opposed to a single modulator 12), enabling the system to address large fields-of-view (FOV) and large fields-of-regards (FOR). By using pixellated modulators 12, the modulation bandwidth can be optimized by selecting the appropriate modulator size, and hence, capacitance, since the modulation speed is RC limited.

Moreover, a "smart" MRR 10 can be realized, since individual modulation elements can be selectively engaged (after appropriate handshaking) so that specific FOV can be addressed, while the remainder of the FOV is not activated, leading to lower power requirements, and to LPI/LPD operation.

FIG. 3 shows a two-dimensional modulator 12 pixel array in which the array is sequentially scanned with a sensing voltage on conductors 18, 19. This array is depicted with only nine modulators 12 for ease of illustration only—practical embodiments will likely have very many modulators 12. The dual-mode modulation/photodetection capability of the ASFP modulator 12 pixels in the array allows sensing which pixel(s), if any, is/are activated by the interrogating optical beam 22 (see FIG. 1). Once the activated pixel(s) is/are detected, the modulation signal is subsequently only applied to that/those pixel(s) using RF switches (preferably MEMS switches) 30, 32, as shown in FIG. 3 or optical switches 30 as shown in FIG. 3a. The interrogating optical beam may have a code applied thereto before shifting to an unmodulated (CW) form. A processor 31 (see FIG. 1) associated with device 10 can be utilized to test the code supplied by the interrogating beam 22 to ensure that the received code is "correct". This allows the device 10 to respond only to interrogating beams 22 from a known source. Once the correct code is identified, then the device 10 communicates with the transmitter 24 by modulating and reflecting the received unmodulated beam 22. The processor 31 is coupled with each modulator 12 in the array either directly or via switches 30.

Since the device 10 has a plurality of pixels 12, it can communicate with a plurality of transmitters 24 at a given time.

Figure 3A:
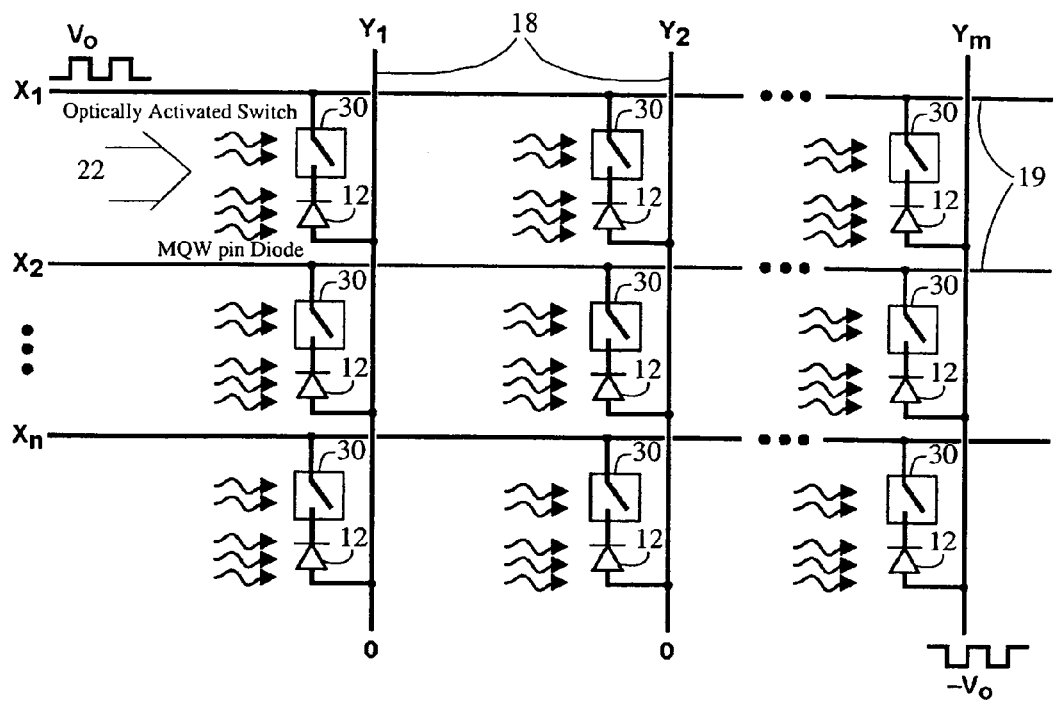
FIG. 3a is a schematic diagram of another embodiment of a two-dimensional AFP MQW modulator pixel array with an optical switch in each pixel for single pixel-at-a-time activation.
Figure 3B:
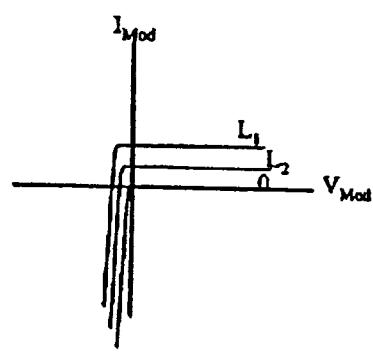
FIG. 3b is a graph of the IN characteristics of an AFP MQW modulator pixel operating as a photodiode.

FIG. 3a shows a two dimensional modulator 12 pixel array in which the array is sequentially scanned with a sensing voltage on conductors 18, 19. This embodiment differs from tile embodiment of FIG. 3 by the addition of optically activated switches (OAS) 30, which may be provided by phototransistors or optically controlled MEM switches, each of which switch 30 is connected in series with an associated modulator 12.

The addressing scheme for the array of modulators 12 shown in FIG. 3a works as follows. Assume that initially the MMR 10 is in a quiescent state with no voltage applied to the individual modulator 12 pixels. This means that all row ($x_n$) and column ($y_m$) electrodes 18, 19 are at zero potential.

The column electrodes 18 are scanned, preferably sequentially, (for m=l to M) to detect any sensing current resulting from the photoactivation of a pixel 12, 30. For example, let us assume that the pixel $x_1, y_1$, is photoactivated by an incoming probe laser 22 focussed on it. The OAS 30 in this pixel is switched on as a result of photoactivation by the incoming beam 22. A sensing photocurrent is sensed in the $y_1$ electrode even with no bias applied to the modulator 12 due to its built-in pin diode (see FIG. 3b). In order to determine the row electrode 19 to which the activated pixel 12, 30 belongs, the rows $x_n$ (for n=1 to N) are scanned, preferably sequentially, with a small negative voltage. As shown in the I-V characteristics of the pin modulator operating as a photodiode (see FIG. 3b), for row electrodes with the photoactivated switch OAS 30 turned on, the small negative photodiode bias results in a reduction of the sensing current from the zero-bias value, while for row electrodes where no pixel is photoactivated, the OAS 30 is switched off and no change in the sensed photocurrent is detected. Thus, the photoactivated pixel 12, 30 (in this case pixel $x_1 y_1$) is determined. If the photoactivated pixel is tuned on by a "friendly" probe beam (as determined by receiving a proper handshaking optical pulse sequence), a modulating voltage waveform may be applied to the corresponding row electrode for that particular pixel, which has its column electrode at zero potential (since its corresponding OAS 30 has been turned on and the small negative voltage applied above has since been removed), if it is desired to communicate with the transceiver 24 sending beam 22. If, on the other hand, the photoactivated pixel 12, 30 is probed by an "unfriendly" source, the handshaking sequence fails and a voltage $V_o$, which is the zero reflection bias for the affected pixel, is preferably applied to the corresponding row electrode. With a $V_o$ bias applied, no light is retroflected to the unfriendly optical transceiver, resulting in a zero glint return.

The column electrodes keep scanning (preferably sequentially) in order to sense any new potential photocurrent resulting from the photoactivation of another pixel 12, 30. Assume, for the moment, that a third column $y_3$ is determined to have some sensing current. Again, the row electrodes $x_n$ (for n=1 to N) are scanned to determine the newly photoactivated pixel by the same scheme described above (the reduction of the sensing current in the photoactivated row by the application of a small negative voltage). Assume that a pixel $x_3 y_3$ is the newly photoactivated pixel with a status of "unfriendly" as determined by a failed handshaking sequence. As described above, a voltage $V_O$, corresponding to the zero reflection bias, is applied to a third row electrode $x_3$ with the column electrode $y_3$ remaining at a zero potential. Now assume that yet another pixel 12, 30 (in this case pixel $x_1 y_3$) is sensed as being photoactivated by another unfriendly source. If the unfriendly probe at $x_3 y_3$ still persists, pixel $x_1 y_3$ will now see the modulated waveform if corrective action is not taken. This is, of course, undesirable. Consequently, the voltage applied to row electrode $x_1$ will temporarily change to $V_O$ corresponding to the zero reflection bias so long as the unfriendly probe at $x_1 y_3$ persists. The chance of this scenario happening is N/N·M or 1/M. Thus if the array is a 100 by 100 array of pixels 12, 30, these scenario should be rather unlikely to occur.

Now assume that pixel $x_1 y_2$ is sensed as being photoactivated with a status of "unfriendly". The voltage applied to column electrode $y_2$ can now be changed from zero to a waveform complementary to the modulating waveform on row electrode $x_1$ with an added dc bias of $V_O$. Thus, the difference between the waveforms on row electrode $x_1$ and column electrode $y_2$ applied to pixel $x_1 y_2$ is simply $V_O$, which corresponds to the zero reflection bias, for the duration of this unfriendly probe. As such pixel $x_1 y_2$ will provide zero glint return to the unfriendly probe.

Finally, assume that pixel $x_2 y_2$ is sensed as being photoactivated with a status of "friendly". Since now the complementary waveform is being applied to the column electrode $y_2$, a constant voltage $V_O$ is applied to electrode $x_2$ to result in the original modulating waveform being applied to the modulator 12 in this pixel.

Thus, this addressing scheme provides a very simple yet effective scheme for addressing the MRR 10 pixels. Note that this is done with only a total number of addressing electrodes equal to the sum of the number of rows and columns (N+M). The introduction of an OAS 30 in each pixel which is associated with (and connected in series with) an associated modulator 12 in each pixel, allows for the OAS 30 to be photoactivated using the same probe light used for retromodulation of the modulator 12 in the pixel. If electrical switches are substituted for the OASs 30, then at least one control electrode would be needed for each such switch 30, resulting in the addition of M–N additional electrodes to the addressing arrangement shown in FIG. 3a. The addition of such additional electrodes is clearly not desirable and thus it is preferred that switches 30 be optically activated.

The switching schemes described with reference to FIGS. 3 and 3a have been based on the assumption that the array is a rectangular array of size M×N. This analogy works well if the array is disposed on a flat surface or if it is disposed on a surface which is easily formed from a flat surface (such as a cylindrical surface) or can be formed without a lot of deformation of the flat surface (such as a gently rolling surface). However, this analogy breaks down on a hemispherical surface since deforming a flat surface causes overlapping folds to occur in formerly flat surface. However, pie or triangular, shaped pieces can be made to assume close to a hemispherical shape, such as the pie or triangular-shaped pieces used to make certain hats, such as baseball caps.

Figure 3C:
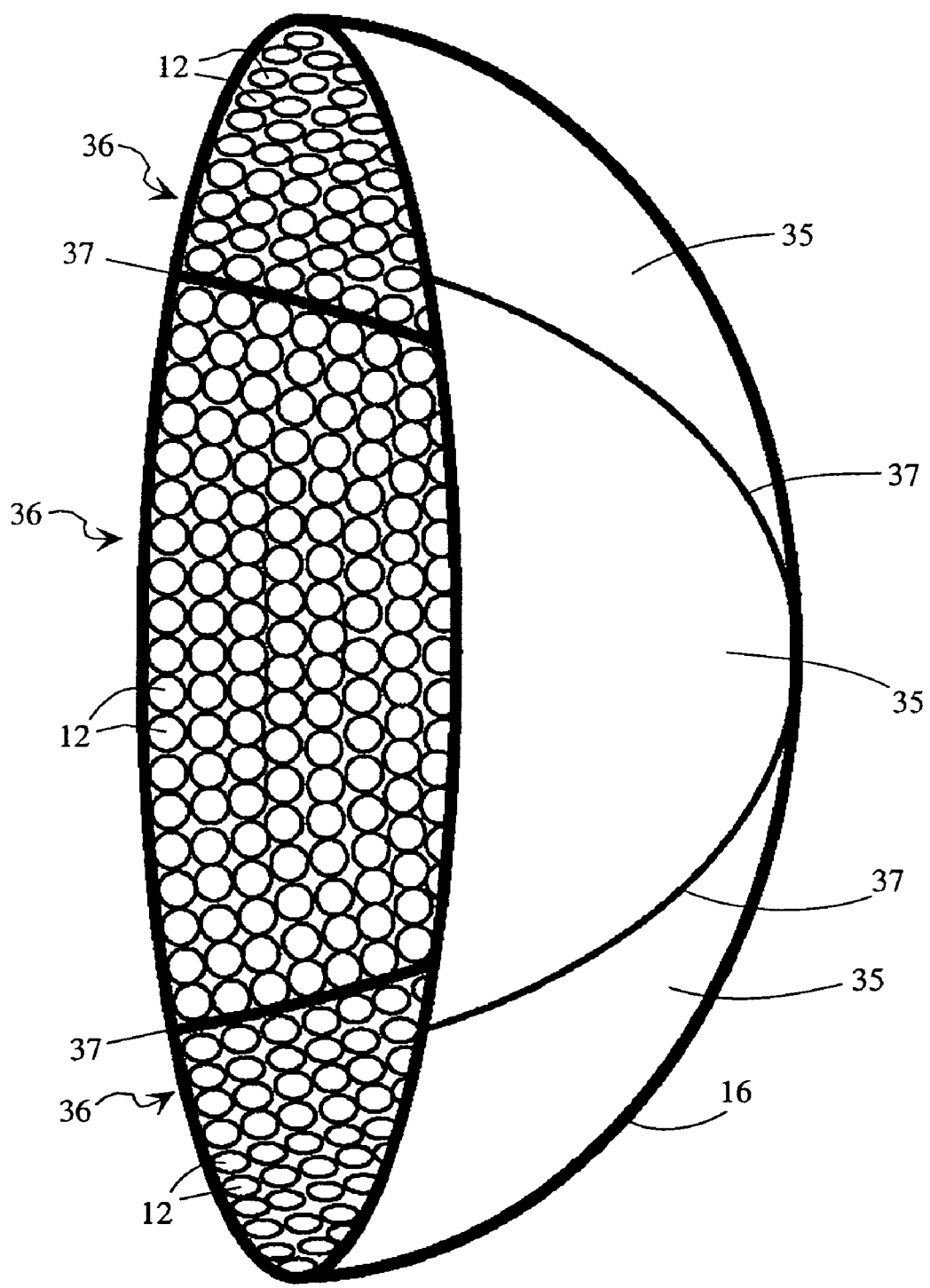
FIG. 3c depicts pie or triangular-shaped planar elements which can be easily deformed into a shape approximating a hemispherical shape.

FIG. 3c shows four pie or triangular-shaped, originally planar, elements 35 which are deformed, as shown, into a shape approximating a hemispherical shape and joined at seams 37. The individual elements 35 may be made as previously described with reference to FIGS. 2a–2e or as taught by U.S. Pat. No. 6,455,931. The elements 35 depicted in FIG. 3c each have an array 36 of modulator/detector pixels 12 which can be addressed using the schemes discussed with reference to FIGS. 3 and 3a, with appropriate modification to reflect the fact that individual elements 35 are more or less triangle-shaped and thus the lengths and orientations of the rows and/or column conductors 18, 19 need be adjusted accordingly. Each element 35 can have its own set of conductors 18,19 (for addressing devices 12) which may be embedded along with the modulator/detector devices 12 in support layer 14, which is preferably deformable.

The term "hemispherical" as used herein is intended to include a hemispherical-like surface formed from originally planar elements 35.

Figures 3D, 3E:
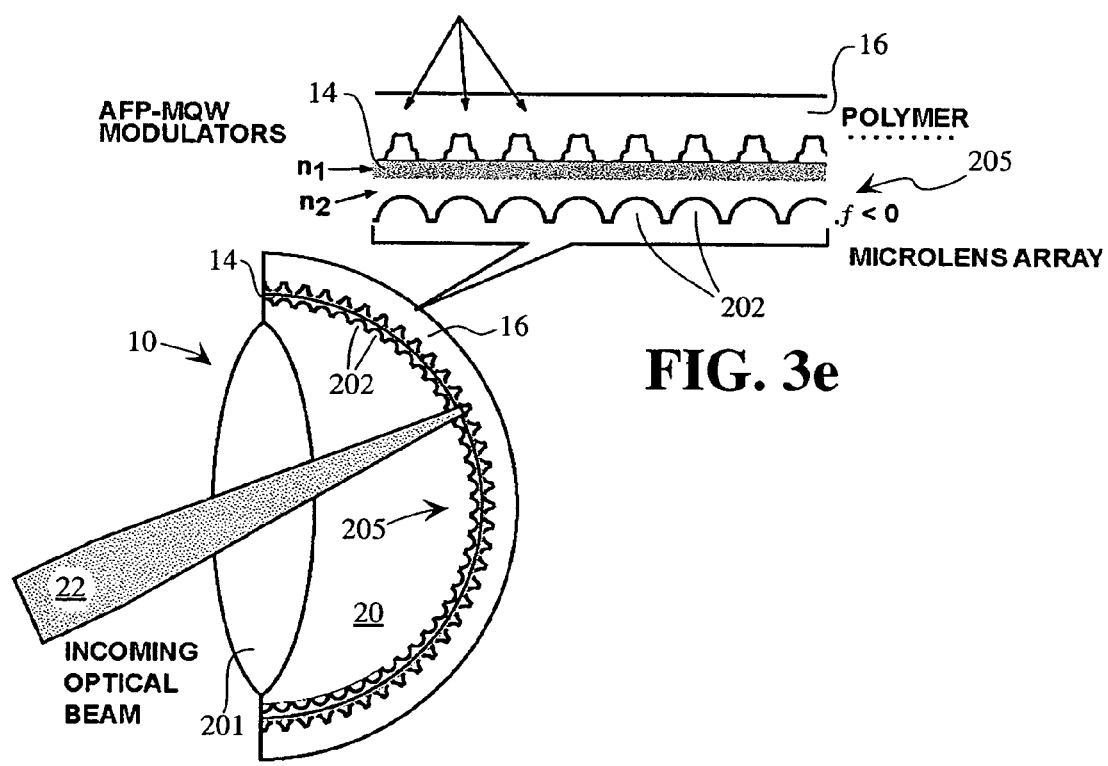
FIGS. 3d and 3e show an alternative optical arrangement for focusing an incoming beam on a modulator/detector MQW device, this alternative optical arrangement including an array of microlenses disposed adjacent the array of modulator/detectors.

FIGS. 3d and 3e show an alternative optical arrangement 20 for focusing an incoming beam 22 on a modulator/detector MQW device 12. In this embodiment, the optical arrangement 20 includes an objective lens 201 and an array 205 of microlens (or lenslets) 202. The objective lens 201 is placed at or near the opening in the hemispherical surface 14. The hemispherical surface 14 is covered by the micro lens array 205 with each microlens 202 being associated with (and centered on) a different modulator/detector 12. The use of microlens (or lenslets) 202 is particularly important if the MQW devices 12 are in an AFP optical configuration since the light impinging a Fabry Perot modulator should be as close to collimated as is reasonably possible to obtain an optimum modulator contract ratio.

FIGS. 3f–3h show how the lens sizes may be determined. FIG. 3f shows an objective lens 20 for the embodiment of FIG. 1, for example. FIG. 3g shows an optical arrangement 20 which comprises an objective lens 201 and microlens 202 configuration for the embodiment of FIGS. 3d and 3e, while FIG. 3h shows a detail of the configuration of microlens 202.

A Multiple Frequency Embodiment

The previously discussed embodiments have had a single AFP MQW device 12 for each pixel. The implicit assumption has been that the devices 12 all operate on a common frequency. In fact, the AFP MQW devices can be arranged in groups wherein each AFP MQW device 12 is responsive to a different frequency of laser light. In that case, each group of AFP MQW devices 12 constitutes a pixel.

In FIG. 4, the AFP MQW devices 12 are grouped in threes, with three MQW devices 12 comprising a pixel. If the AFP MQW devices 12 of FIG. 4 are of the same size as the AFP MQW devices 12 of FIG. 1, then the pixel size is, of course larger, and the optical arrangement 20 is thus adapted to throw a spot 25 (see FIG. 4b) of focused laser light on one pixel of three AFP MQW devices 12. An AFP MQW device is responsive over a very short frequency range (about 10 nm in terms of wavelength). Thus, the AFP MQW devices in each group or pixel need not be widely spaced in terms of their frequency responsiveness and thus the optical arrangement 20 can utilize either a single lens or, as shown by FIGS. 3d and 3e, an objective lens 201 plus an array 205 of microlenses 202 and still focus the incoming beams 22 of different frequencies on the pixels. If the frequencies are relatively widely spaced (for example: 850, 1300 and 1550 nm center wavelengths), then a purely reflecting rather than a catadioptric or refracting system could be utilized (see FIG. 4c) or multiple lenses could be used in order to minimize chromatic dispersion. As such, the objective lens 201 may be implemented as a series of lenses in order to compensate for chromatic dispersion.

FIG. 4a is a more detailed side section view of a few of the AFP MQW devices 12 with an indication of the particular frequency (in term of wavelengths: $\lambda_1$, $\lambda_2$, and $\lambda_3$) to which each is responsive. Three AFP MQW devices 12 make up a pixel, but instead of a linear arrangement of three AFP MQW devices as schematically depicted in FIG. 4a, in actuality a pixel is preferably comprised of three AFP MQW devices 12 disposed in a triangular pattern, when viewed in plan view, as shown by FIG. 4b.

The "color" or frequency of the laser light can be used, if desired, to convey information such as the source of the data or its importance.

Also, the use of multiple colors, such as is found in fiber optic Wavelength Division Multiplexing (WDM) technology, can be used to increase the total throughput (data rate) of the MRR.

A MRR Optical Repeater

The MRR 10 with an associated processor 31 and a back plane switch 28 can be utilized as an optical repeater or relay point. See FIG. 5. MRR 10 can receive a message from one transmitter 24a on beam 22a and then relay that message along to one or more other transceiver(s) 24b by modulating the beam(s) 22b from transceiver(s) 24b and reflecting it (or them) back to transceiver(s) 24b. This data exchange can occur simultaneously or sequentially. For example, assume that transceiver 24a is the source of a message to be passed to at least one remote transceiver 24b. Transceiver 24a initiates matters by contacting MRR 10 by sending a probe beam 22a and going through a handshaking sequence whereby processor 31 confirms that transceiver 24a is "friendly." Transceiver 24a sends a message to the processor 31 via back plane switch 28 and processor 31 which can be stored, for example, in a cache memory 33 associated with processor 31. The message would preferably include routing information indicating the stations (transceivers) permitted to receive the message, whether the message may be stored for later delivery, whether a receipt acknowledgement should be sent back to station 24a, how long the message is to remain in the cache 33 before being cleared, etc.

Assume that transceiver 24a sends a message to be relayed to transceiver 24b. If transceiver 24b is "on-line", that is it has gone through a handshaking sequence with the MMR 10 and processor 31 already, then the incoming message from transceiver 24a can be directly routed to the particular pixel or pixels 12 in communication with transceiver 24b directly through back plane switch 28. If transceiver 24b is not on line, then the message can be stored in a cache 33 associated with processor 31 for later delivery.

Figure 5:
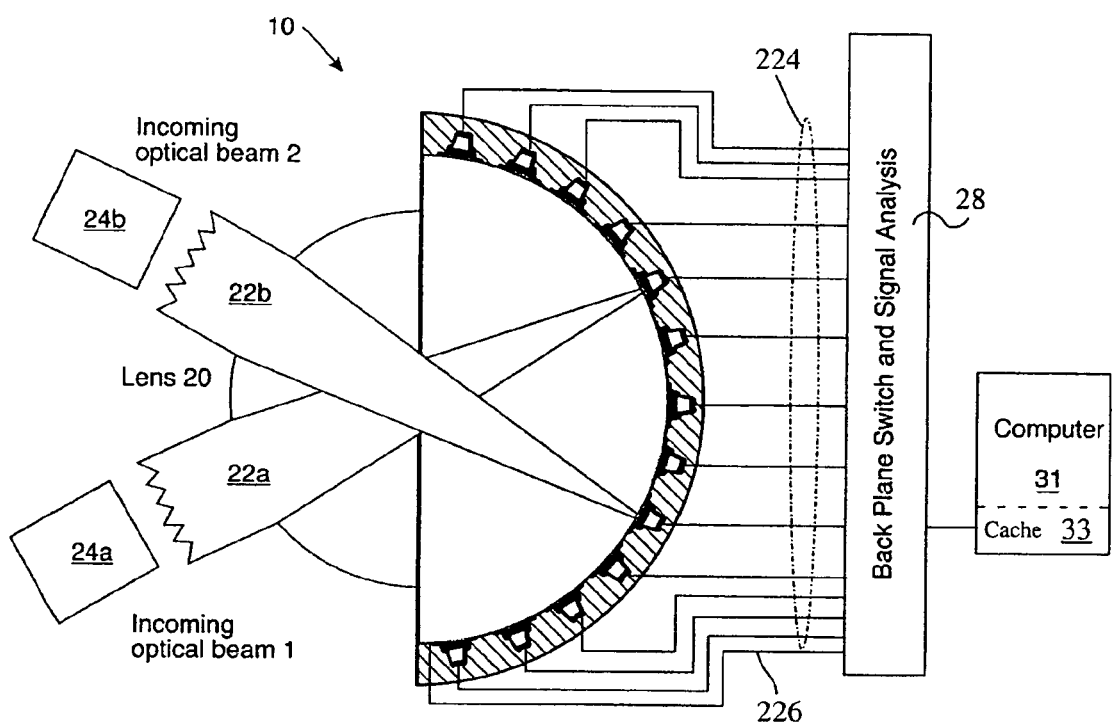
FIG. 5 is a schematic view of a conformal pixellated structure be utilized as a passive optical repeater.

Multiple communication paths can transit the device of FIG. 5. Thus, different elements 12 can be modulated with different retro-information. This can result in a more robust network node as well as to an optical interconnect/relay device, since different FOVs within the overall FOR can be addressed with independent information. This can lead to an optical interconnection device, as well as a device with LPI/LPD, since other FOV elements need not be activated.

In terms of fabrication, the devices 12 in each pixel can have a different and distinctive shape so that fluid transport self-assembly techniques can be used to place the individual devices into proper places in a molded structure, for example.

In FIG. 5, each AFP MQW device 12 has it own connection 224 to back plane switch 28 and a common connection 226 shared by all pixels 12. This is an alternative connection scheme to that disclosed by FIGS. 3 and 3a. The primary disadvantage of this scheme is that the number of connections to switch 28 increases dramatically compared to the X,Y schemes of FIGS. 3 and 3a. For example, if the pixels are arranged in a 100×100 array, the schemes of FIGS. 3 and 3a call for 100 column electrodes and 100 row electrodes (or 200 total connections), while the scheme of FIG. 5 calls for 10,000 connections, which would likely to be considered to be unwieldy by most persons skilled in the art. On the other hand, the scheme of FIG. 5 does have certain advantages when assumptions are made about communicating with multiple pixels on a common row or a common column. So, as in many things, there is an engineering trade off to be made and that which is preferred will depend upon the circumstances. One possibility would be to divide a large array into a number of smaller arrays, which each smaller array having its own X,Y addressing scheme (like FIG. 3 or 3a). For example, if a 100×100 array is viewed as sixteen 25×25 pixel arrays, then the number of connections would be fifty per subarray or 800 total connections. Moreover, the subarrays need not be square. Triangularly shaped subarrays of pixels can certainly be formed (as could other shapes). Such triangularly shaped subarrays can be formed on wafers which are, as will be seen, arranged in a hemispherical shape like a geodesic dome.

Geodesic Hollow Structure Embodiment

Another embodiment of device 10 involves an array or arrangement of sub-wafers, with each sub-wafer comprised of a monolithic array of pixels (with each pixel individually addressed for detection/modulation functions or addressed in an X,Y scheme, as desired). As an example, each sub-wafer may consist as an array of 100 total, pixellated devices 12 (say, ten by ten pixels), with all the electrical connections to the individual pixels included in the sub-wafer chip. An ensemble of these sub-wafers, in turn, is used to form the entire retro-modulator device 10. One such arrangement can be an ensemble of polygons (e.g., triangles), of dimensions of about 1 mm on a side, with each triangular wafer chip containing a number of 100 µm pixels. These triangular sub-wafers can be assembled into an approximate cat's eye retro-reflector by employing a geodesic hemispherical dome as a housing. The geodesic dome consists of an array of polygons arranged so that each edge of the polygons meets the adjacent edges of the neighboring polygons so that the overall structure approximates the shape of a smooth hemisphere. Each triangular (or, polygon, in general) sub-wafer is placed on the inner surface of the geodesic hemisphere so that its dimensions are exactly equal to the geodesic structure. In this manner, an array of flat triangular wafers can have an overall large shape that approximates a hemisphere. This structure enables one to fabricate a retro-modulator device 10 with fewer overall assembly steps (since a given triangular wafer contains many pixels), and, thus fewer individual connection points (since all the connections within each sub-wafer are resident on that given chip). Since the overall device may have a small effective optical aperture, d (say, about 1 mm to 1 cm), then the diffraction effects (lambda/d) may be on the same order as the penalty paid due to the segmented geodesic device relative to a smooth hemispherical structure.

Additional Comments and Modifications

The disclosed structures enable one to realize a modulation capability with large depth-of-modulation at low modulation voltages, with a very efficient dark (i.e., off) state. This further reduces the overall power consumption of the device. The individual pixels of this device function both as an optical modulator as well as an optical detector. It may not be obvious to one skilled in the art of optical modulators (e.g., spatial light modulators, beam control devices, etc.) that a modulator can also function as a detector. Moreover, it may not be obvious to one skilled in the art of optical detectors (say, optical receiver design and photodetection) that a detector can also function as an optical modulator. Furthermore, it may not be obvious to one skilled in the art that, in accordance with one aspect of the present invention, the necessary condition to electrically bias the detector for maximum detection performance (i.e., to enable all the photons incident on the device to interact with the MQW) is precisely the same electrical bias required to optimize the contrast ratio when using the device as an optical modulator (i.e., provide for an "off state" with zero retro-reflectance).

The use of self-assembly techniques also enables one to fabricate devices with different wavelength structures in a planar architecture, novel multi-wavelength structures (i.e., stacked MQWs), etc. Moreover, this fabrication process can enable rapid upgrading of the devices, since new MQWs can be retrofitted into existing substrate structures. Finally, this process, can enable high-yield devices to be realized, since the individual pixels can be tested and qualified prior to their self-assembly step, thereby optimizing the probability that the final structure will be 100% functional.

It should be noted that several different device methodologies can be realized in terms of pixel size relative to the smallest resolvable FOV. In one case, the dimension of the modulation pixels can be chosen so that each resolvable sub-FOV is addressed by a single pixel element (on the order of 100 to 500 µm). In another case, several pixels can be used to service a given sub-FOV. In the latter case, the modulation signal can be multiplexed among the group of pixels and/or different pixels within this group can be designed to service different wavelengths, so that the MRR device 10 can be more robust or have a higher data transfer rate using WDM technology.

The MRR structure 10 can either be placed in a concave surface, over a convex surface to service a very large field-of-regard (similar to the eye of a fly or bee), or conformal to a general surface (such as an airborne platform, a satellite, an automobile, etc.) or it can remain flat. The basic device can be fabricated using conventional optical components as well as diffractive optical elements. In the former case, lenses or mirrors can be employed for cat's eye or corner-cube MRR, whereas in the latter case, diffractive (reflective or transmissive) elements can replace conventional optics. Finally, the overall fill factor of the device can be optimized by employing a lenslet array (or diffractive optical equivalent) so that most of the incident beam over a given FOV is focused onto a given pixel. In this manner, the insertion loss of the MRR device 10 can be minimized.

The MQW devices 12 are referred to both as modulators and as detectors herein. These devices can function as either a modulator or a detector depending on how they are biased, and for most embodiments it is believed that the operational flexibility will dictate that devices 12 be able to function as both modulators or detectors by changing their electrical bias. However, some practicing the present invention may choose to operate certain ones (or all) of the devices 12 as detectors in some embodiments and/or choose to operate certain ones (or all) of the devices 12 as modulators in other embodiments.

Having described this invention in connection with a preferred embodiment, modification will now certainly suggest itself to those skilled in the art. As such, the invention is not to be limited to the disclosed embodiments except as required by the appended claims.

What is claimed is:

1. A method of addressing an array of AFP MQW pixels having first and second sets of electrodes comprising:
   (a) scanning the first set of electrodes to detect any sensing current resulting from the photoactivation of a pixel while the second set of electrodes is scanned with a small negative voltage;
   (b) if a pixel is detected in step (a) as being photoactivated, sampling any data received by the photoactivated pixel in handshaking protocol to determine whether a party photoactivating the photoactivated pixel is friend or foe;
   (c) if the photoactivated pixel is turned on by a friend, applying a modulating voltage waveform to a corresponding electrode in the second set of electrodes corresponding photoactivated pixel;
   (d) if the photoactivated pixel is turned on by a foe, a voltage V, which is a zero reflection bias for the photoactivated pixel, is applied to a corresponding electrode in the second set of electrodes corresponding photoactivated pixel.

2. A method of optically repeating or relaying data comprising:
- disposing a two-dimensional array of modulator and/or detector pixels in a predetermined configuration, the modulator and/or detector pixels responding to applied electrical signals to modulate and reflect light impinging the modulator and/or detector pixels;
- directing a first incoming optical beam from a first optical transmitter onto a first selected one or ones of said modulator and/or detector pixels in said array, the first incoming optical beam being modulated with data;
- directing a second incoming optical beam from a second optical transmitter onto a second selected one or ones of said modulator and/or detector pixels in said arrays;
- detecting the data on the first incoming optical beam; and
- modulating the second incoming beam at said second selected one or ones of said modulator and/or detector pixels in said array using said data;
- wherein the second incoming beam is reflected at said second selected one or ones of said modulator and/or detector pixels via the optical arrangement back to said second optical transmitter and is modulated by said data.

3. The method of claim 2 wherein the two dimensional array of modulator and/or detector pixels is disposed in a hemispherical configuration.

4. The method of claim 2 further including temporarily storing data received from one source and modulating a beam from another source with the temporarily stored data.

5. A method of optically relaying data comprising:
- disposing a two dimensional array of modulator and/or detector pixels in a predetermined configuration, the modulator and/or detector pixels responding to applied electrical signals to modulate and reflect light impinging the modulator and/or detector pixels;
- directing a first incoming optical beam from a first optical transmitter onto a first selected one or ones of said modulator and/or detector pixels in said array, the first incoming optical beam being modulated with data;
- directing a second incoming optical beam from a second optical transmitter onto a second selected one or ones of said modulator and/or detector pixels in said array;
- storing the data on the first incoming optical beam in memory; and
- modulating the second incoming beam at said second selected one or ones of said modulator and/or detector pixels in said array using said data stored in said memory;
- wherein the second incoming beam is reflected at said second selected one or ones of said modulator and/or detector pixels via the optical arrangement back to said second optical transmitter.

6. A method of operating a Fabry-Perot multiple quantum well structure both as an optical modulator and as an optical detector by fixing its electrical bias potential for maximum detection performance when operating as a detector and for optimum contrast ratio when operating as a modulator.

7. The method of claim 6 within the Fabry-Perot multiple quantum well structure includes a pin diode structure and an associated optically activated switch, the associated optically activated switch being switched on in response to an incoming optical beam allowing the pin diode of the Fabry-Perot multiple quantum well to generate a sensing current.

8. A method of addressing an array of AFP MQW pixels having first and second sets of electrodes comprising:
(a) scanning the first and second sets of electrodes to detect any sensing current resulting from the photoactivation of a pixel;
(b) if a pixel is determined in step (a) as being photoactivated, detecting data received by the photoactivated pixel in handshaking protocol to determine whether a party photoactivating the photoactivated pixel is friend or foe;
(c) if the photoactivated pixel is activated by a friend, applying a modulating voltage is applied to the photoactivated pixel; and
(d) if the photoactivated pixel is turned on by a foe, the photoactivated pixel receives a zero reflection bias.

* * * * *